United States Patent

Tiller et al.

[11] Patent Number: 5,918,167
[45] Date of Patent: Jun. 29, 1999

[54] QUADRATURE DOWNCONVERTER LOCAL OSCILLATOR LEAKAGE CANCELLER

[75] Inventors: Samuel Alfred Tiller, Ottawa; John Jackson Nisbet, Nepean, both of Canada

[73] Assignee: Northern Telecom Limited, Montreal, Canada

[21] Appl. No.: 08/815,121

[22] Filed: Mar. 11, 1997

[51] Int. Cl.[6] .................................................. H04B 1/26
[52] U.S. Cl. ......................... 455/310; 455/317; 455/318; 455/324; 455/234.1
[58] Field of Search ............................ 455/232.1, 234.1, 455/234.2, 310, 314, 317, 318, 324, 303; 375/324, 345; 329/318, 319

[56] References Cited

U.S. PATENT DOCUMENTS

| 4,360,929 | 11/1982 | Isobe | 455/245 |
|---|---|---|---|
| 4,656,406 | 4/1987 | Houskamp | 318/587 |
| 4,814,715 | 3/1989 | Kasperkovitz | 329/319 |
| 4,970,519 | 11/1990 | Minnis et al. | 342/165 |
| 5,017,841 | 5/1991 | Miura | 329/325 |
| 5,321,852 | 6/1994 | Seong | 455/324 |
| 5,400,363 | 3/1995 | Waugh et al. | 375/80 |
| 5,530,929 | 6/1996 | Lindqvist et al. | 455/324 |
| 5,535,432 | 7/1996 | Dent | 455/77 |
| 5,606,731 | 2/1997 | Pace et al. | 455/260 |
| 5,613,233 | 3/1997 | Vagher | 455/296 |
| 5,761,615 | 6/1998 | Jaffee | 455/314 |

OTHER PUBLICATIONS

Asad A. Abidi, "Low–Power Radio–Frequency IC's For Portable Communications", Proceedings of the IEEE, vol. 83, No. 4, Apr. 1995, pp. 544–569.

Asad A. Abidi, "Direct–Conversion Radio Transceivers For Digital Communications", IEEE Journal of Solid–State Circuits, vol. 30, No. 12, Dec. 1995, pp. 1399–1410.

*Primary Examiner*—Nguyen Vo
*Assistant Examiner*—Duc Nguyen

[57] ABSTRACT

A quadrature downconversion stage in a radio frequency receiver compensates for leakage from the quadrature local oscillator to the input of the stage by deriving first and second feedback signals from the quadrature local oscillator. The first feedback signal is 180° out of phase with the in-phase component of the signal supplied to the input of the stage and the second feedback signal is 180° out of phase with the quadrature component of the signal supplied to the input of the stage. The invention reduces or cancels a d.c. offset that can appear at the output of the stage. Another advantage is the reduction of re-radiated signals resulting from the local oscillator leakage. The invention is particularly applicable to direct converters.

11 Claims, 5 Drawing Sheets

QUADRATURE DOWNCONVERTER LOCAL OSCILLATOR LEAKAGE CANCELLER

FIELD OF THE INVENTION

This invention relates to radio receivers and, in particular, to such receivers using quadrature downconversion.

BACKGROUND OF THE INVENTION

The majority of wireless communication systems require a frequency converter to translate the high frequency input signal to a lower frequency for further processing. This is accomplished by mixing the input with a locally generated frequency source. The resultant lower frequency difference term is then passed to the remainder of the receiver where it is more easily handled. Two approaches to wireless reception are available, utilizing direct or indirect conversion of the high frequency input signal to baseband. The best known example of the latter class is the superheterodyne receiver which downconverts to an intermediate frequency. In contrast, direct converters translate the RF input directly to baseband with zero intermediate frequency. Such receivers are relatively uncommon in mobile phones but common in paging systems although there is an increasing interest in applying them to mobile cellular communications.

A common problem encountered in both class of wireless receivers is effective local oscillator (LO) leakage isolation. Since frequency mixers have finite LO to RF isolation, some of the LO signal appears at the receiver input and can be observed at the antenna. If there is inadequate filtering, the magnitude of this re-radiated signal may exceed the limit set by regulatory authorities in respect of spurious emissions (FIG. 1a). Furthermore, it may have a detrimental effect on receiver performance since any LO leakage into the antenna may reflect off external objects back into the antenna and self-downconvert through the mixer to produce a spurious reception response. Such LO leakage is apparent in both indirect and direct downconverters, but is of a particular annoyance in the latter.

In direct conversion receivers the LO leakage can downconvert and contribute to a troublesome dc offset in the baseband section of the receiver following the mixer. This offset appears in the middle of the downconverted signal spectrum, and may be larger than the signal itself and much larger than thermal and flicker noise (FIG. 1b). Unless the offset is removed, the signal-noise ratio at the detector input will be low. There are a number of other sources which can contribute to an appreciable offset other than LO leakage, e.g. mismatch in the circuitry or dynamic effects such as thermal or ageing or peculiar to the wireless environment. Whatever their means of generation, these offsets are especially problematic when their magnitude changes with receiver location and orientation.

Attempts to limit the LO leakage have sought to prevent re-radiation by including additional shielding, reverse isolators and ac coupling. These physical solutions are not conducive to lightweight hand-held units used in mobile cellular communications. It has been proposed previously to cancel the dc offset after the downconversion stage using a manually controllable variable resistor or an A/D compensation technique at baseband but this is cumbersome. The first method only attempts to address the problem of static offset and neither method reduces the re-radiated local oscillator leakage.

SUMMARY OF THE INVENTION

It is an object of this invention to provide a quadrature downconversion in which the LO leakage problem is significantly reduced or eliminated.

According to a broad aspect, the present invention provides a quadrature downconversion stage for an RF receiver, the quadrature downconversion stage comprising: a stage input; a first, in-phase branch connected to the stage input; a second, quadrature branch connected to the stage input; and a quadrature local oscillator having an in-phase output and a quadrature output, the first branch comprising a first mixer having a first input connected to the stage input, a second input connected to the in-phase output of the quadrature local oscillator and an output on which is derived an in-phase baseband output component and a first feedback circuit coupling the in-phase output of the quadrature local oscillator to the first input of the first mixer thereby to supply a feedback signal which is 180° phase shifted with respect to the in-phase component supplied to the second input of the first mixer, the second branch comprising a second mixer having a first input connected to the stage input, a second input connected to the quadrature output of the quadrature local oscillator and an output on which is derived a quadrature baseband output component and a second feedback circuit coupling the quadrature output of the quadrature local oscillator to the first input of the second mixer thereby to supply a feedback signal which is 180° phase shifted with respect to the quadrature component supplied to the second input of the second mixer.

Although the inventive technique was developed for a direct conversion wireless receiver, it is also applicable to an indirect conversion receiver and the receiver, whether involving direct or indirect conversion, may be wireless or wireline.

In the direct conversion receiver, the quadrature downconversion stage input is the input for the radio frequency signal and the quadrature local oscillator is an RF oscillator.

In the indirect conversion receiver, there is a first mixing stage to which the radio frequency signal is input, this first mixing stage comprising an RF local oscillator and a mixer which mixes the output of the local oscillator with the RF signal to provide an IF (intermediate frequency) output. The IF output is supplied to the input of the quadrature downconversion stage and the quadrature local oscillator operates in an IF range. The quadrature downconversion stage may be directly connected to the first mixing stage or it may be the final stage of a succession of stages.

According to the preferred aspect of the invention, re-radiated LO levels are reduced by adding the correct amount of LO signal with 180 degrees phase shift from the leakage. A quadrature downconverter offers a means of generating any desired amplitude and phase using simple multipliers. Any component of the radio frequency local oscillator (RFLO) present at the RF input of the mixer will have a defined phase relationship with the RFLO at the input to the quadrature splitter. In the static case, the phase difference will also be static. Thus, when the RF input signal is multiplied by the RFLO signal, there will be a DC component at each baseband output proportional to the amplitude of the leakage and the cosine of the phase difference between the RFLO and the leakage signal. This DC signal is used to drive an inverting AGC to set up a negative feedback system to cancel the LO leakage at the RF input by forcing the DC at the output to zero.

Thus, the invention has the effect of reducing or cancelling the DC offset in the baseband output as well as cancelling or reducing re-radiation from the antenna due to the local oscillator leakage.

BRIEF DESCRIPTION OF THE DRAWINGS

Preferred embodiments of this invention will now be described with reference to the attached drawings in which.

DETAILED DESCRIPTION OF THE PREFERRED EMBODIMENTS

Figure 1A:
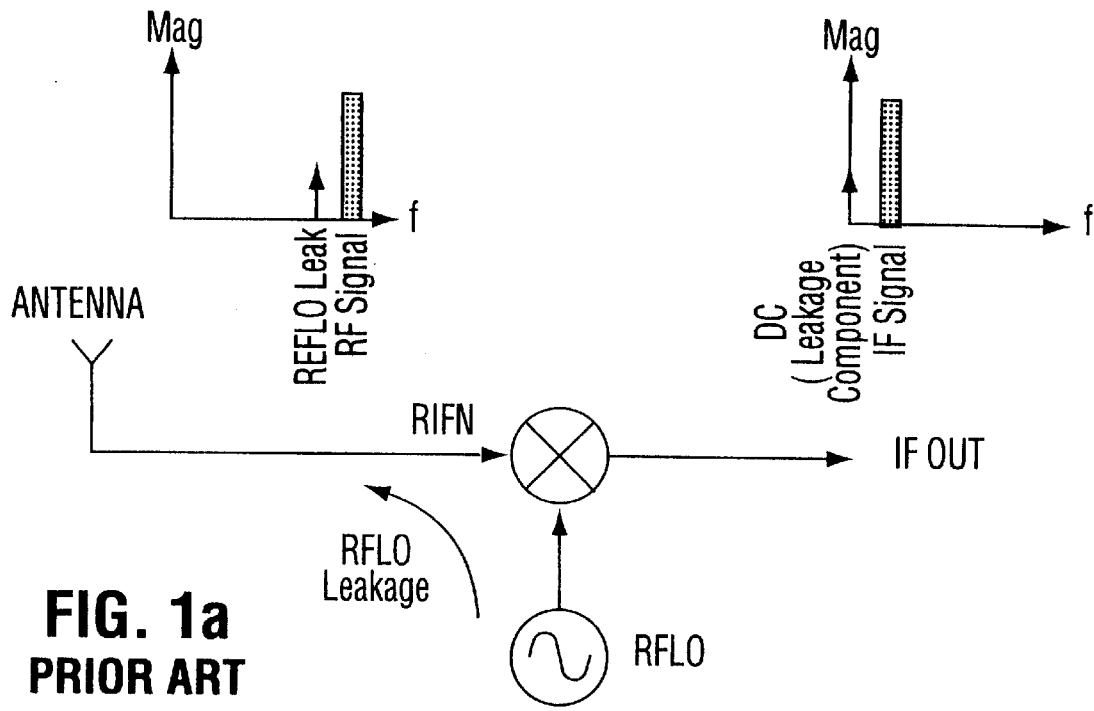
FIG. 1a is a schematic diagram illustrating leakage in an indirect converter receiver.
Figure 1B:
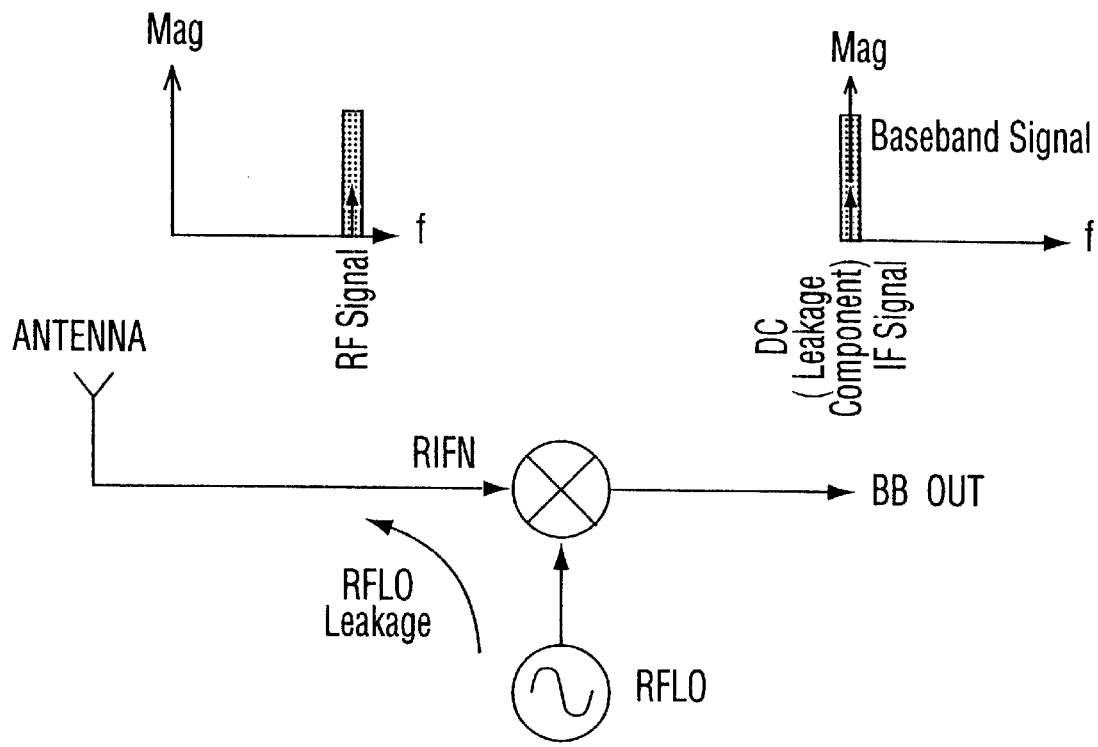
FIG. 1b is a schematic diagram illustrating leakage in a direct converter receiver.
Figure 2:
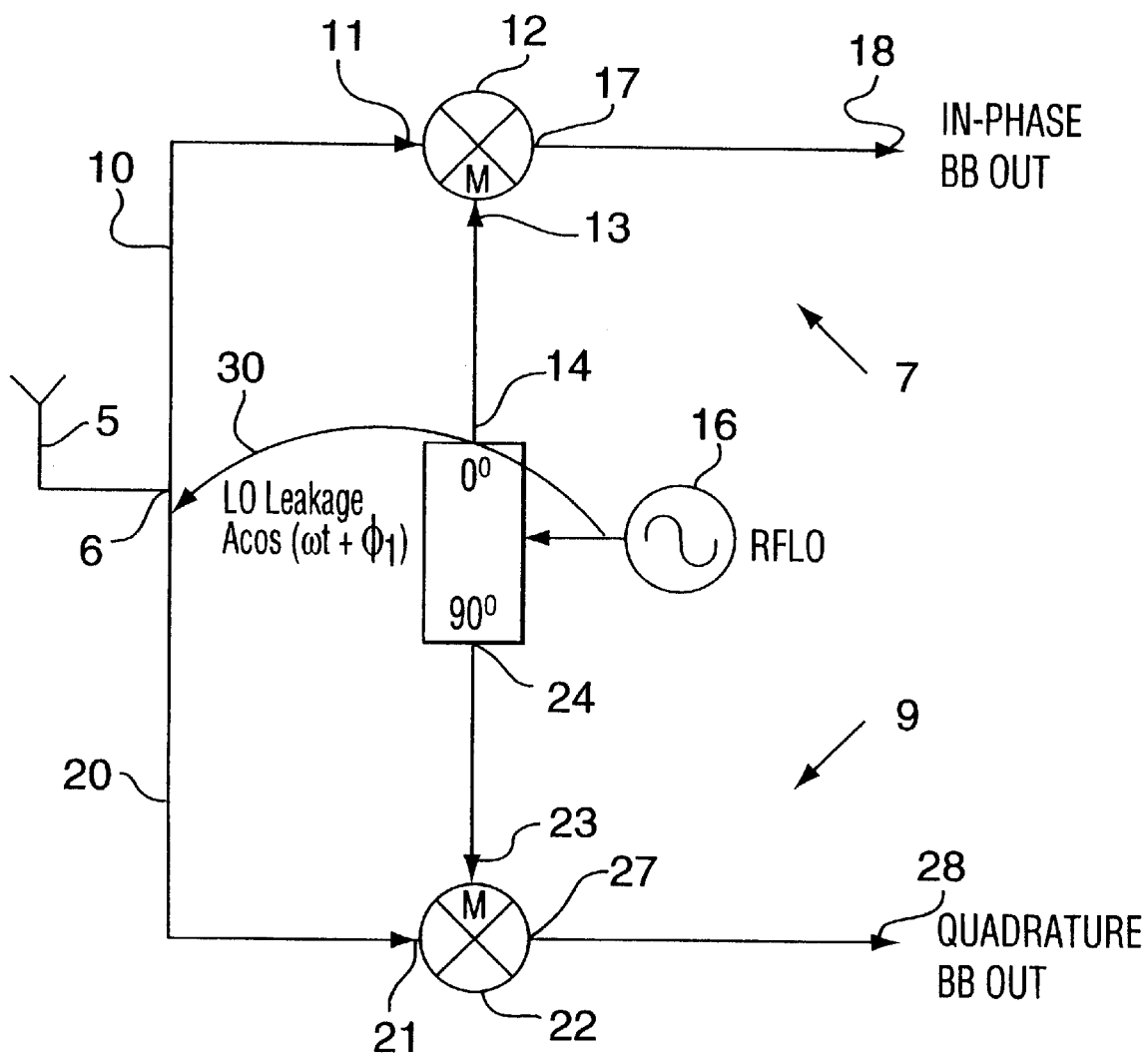
FIG. 2 is a schematic representation of a conventional quadrature downconverter direct converter receiver.

Referring to FIG. 2 which illustrates a conventional quadrature downconverter direct converter receiver, an antenna 5 is connected to a junction 6 of an in-phase arm 7 and a quadrature arm 9. It is noted that instead of a simple wire interconnection as shown the junction 6 could be achieved by a power splitter which is a device well known in the art for providing proper matching and power division in electronic circuits.

More specifically, the in-phase arm 7 includes a line 10 connected between the junction 6 and an input 11 of a mixer 12. Another input 13 of the mixer 12 is connected to the in-phase output 14 of a quadrature radio frequency local oscillator (RFLO) 16. The output 17 of the mixer 12 provides the in-phase baseband (BB) signal represented at 18.

Similarly, the quadrature arm 9 includes a line 20 connected between the junction 6 and an input 21 of a mixer 22. Another input 23 of the mixer 22 is connected to the quadrature output 24 of the quadrature radio frequency local oscillator 16. The output 27 of the mixer 22 provides the quadrature baseband signal represented at 28.

When the circuit of FIG. 2 is in operation and assuming the signal generated by the local oscillator 16 is represented by $\cos(\omega t)$, there will be a leakage signal with the same frequency and some arbitrary phase shift relative to the local oscillator which is leaked from the local oscillator 16 to the junction 6 as represented by the curved arrow 30. This leakage signal can be written as $A\cos(\omega t+\phi 1)$ where A is an amplitude and $\phi 1$ represents the phase difference between the leakage signal and the local oscillator signal. The leakage signal $A\cos(\omega t+\phi 1)$ is applied to the input 11 of mixer 12 where it is mixed with the signal $\cos \omega t$ which is the in-phase component of the local oscillator signal applied to the input 13 of mixer 12. The mixer multiplies these two signals with a gain M, which results in an error signal at output 17 resulting from the leakage of:

$$\frac{MA}{2}[\cos(\phi 1) + \cos(2\omega t + \phi 1)] \qquad (1)$$

Similarly an error signal resulting from the local oscillator leakage is derived at output 27 of mixer 22 and this can be represented by:

$$\frac{MA}{2}[-\sin(\phi 1) + \sin(2\omega t + \phi 1)] \qquad (1a)$$

Figure 3:
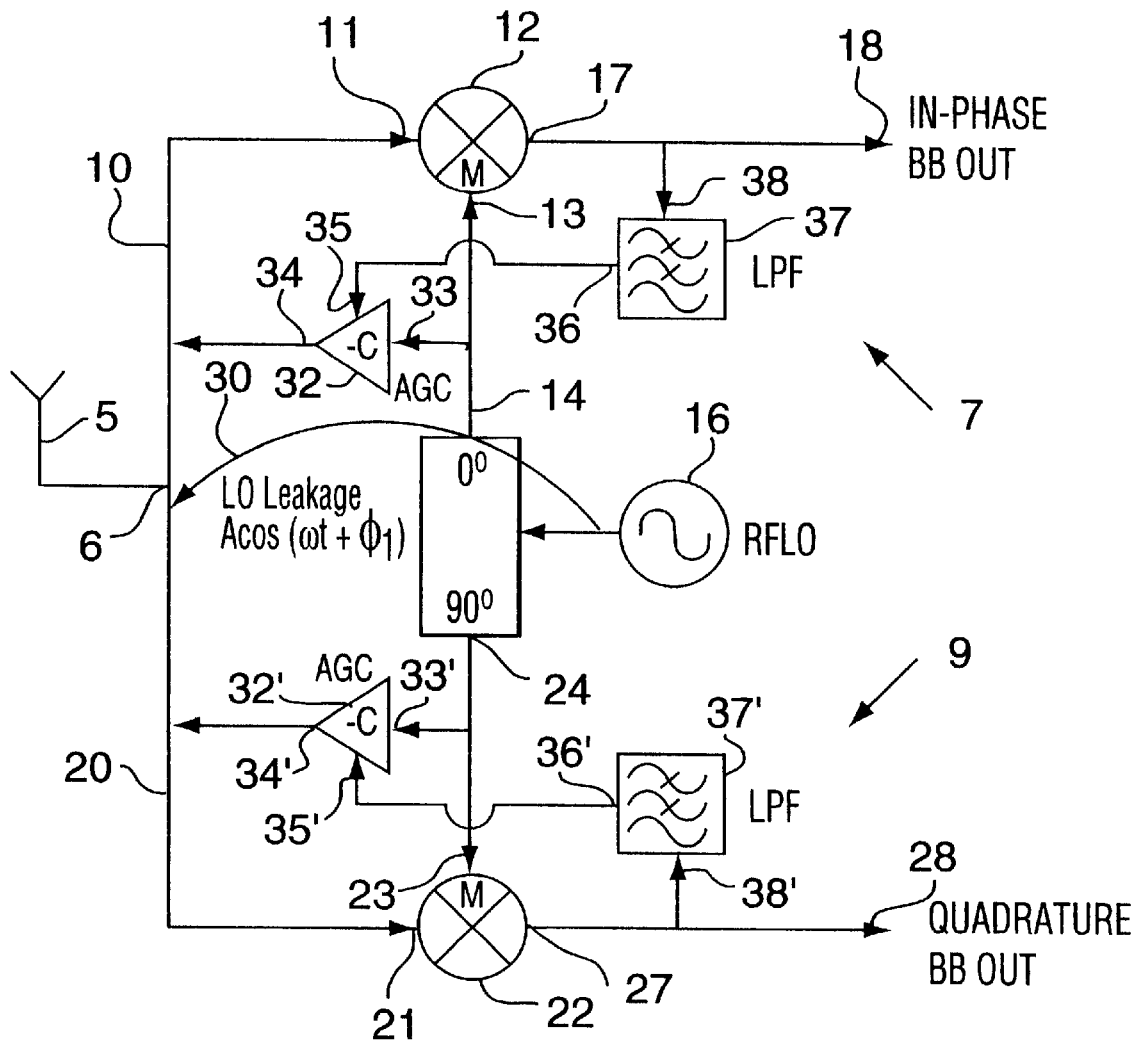
FIG. 3 is a diagram similar to FIG. 2 but including leakage cancellation according to the invention.

Referring now to FIG. 3 which illustrates an embodiment of the present invention designed to eliminate the effect of the oscillator leakage, all of the components of FIG. 2 are included in FIG. 3 and are connected in the same configuration, these components being identified by the same reference numerals. In addition, two feedback circuits are provided, one on the in-phase side and a similar one on the quadrature side.

The feedback circuit on the in-phase side includes an automatic gain control circuit (AGC) 32 having an input 33 connected to the in-phase output 14 of the local oscillator 16 and an output 34 connected to the junction 6 via line 10. A control input 35 of AGC 32 is connected to an output 36 of a low pass filter (LPF) 37 the input 38 of which is connected to the output 17 of mixer 12. The feedback circuit on the quadrature side comprises the same components connected in the same way as the in-phase feedback circuit and, accordingly, those components have been identified using the same numerals but with a prime notation.

The operation of the in-phase feedback circuit will now be described. As indicated above, without feedback the signal resulting from leakage which appears at output 17 is given by equation (1) as:

$$\frac{MA}{2}[\cos(\phi 1) + \cos(2\omega t + \phi 1)] \qquad (1)$$

This term has a high frequency component and a low frequency component. Once the signal passes through the LPF only the low frequency component remains. This is expressed by:

$$\frac{MA}{2}\cos(\phi 1) \qquad (2)$$

We can refer to this signal as the dc component at the in-phase mixer output or simply Idc. This low frequency component is used to amplitude modulate the in-phase local oscillator signal present at output 14 through the AGC 32. The gain of the AGC 32 is set by the control voltage at control input 35 and the gain constant, $-C$, of the AGC 32. There is also a phase shift $\phi c$ through the AGC 32 which must be accounted for. The resultant output at 34 is given by:

$$-IdcC(\cos(\omega t+\phi c)) \qquad (3)$$

We can now write the equation which describes the input signal at junction 6 as:

$$A\cos(\omega t+\phi 1)-IdcC\cos(\omega t+\phi c) \qquad (4)$$

Returning to equation (2), we observe that the low frequency output is proportional to both the amplitude and the phase of the leakage term. If the circuit can be adjusted such that the output 36 of the LPF 37 is zero, we can say that there is no in-phase component of the local oscillator present at the input junction 6 of the circuit. Note that there may still be a quadrature local oscillator component since the multiplication will not produce any terms on the in-phase arm.

Now that we have an expression for the input signal, we can examine the low pass mixer output signal to derive an expression for the magnitude of this signal in terms of the circuit parameters. The unfiltered output signal is given by:

$$Idc = (A \cos(\omega t + \phi 1) - IdcC \cos(\omega t + \phi c)) M \cos(\omega t) \quad (5)$$

Solving for Idc:

$$Idc = \frac{MA\cos(\omega t)\cos(\omega t + \phi 1)}{1 + MC\cos(\omega t)\cos(\omega t + \phi c)} \quad (6)$$

Expanding and discarding the higher frequency terms gives:

$$Idc = \frac{MA\cos(\phi 1)}{2(1 + MC\cos(\phi c))} \quad (7)$$

A similar expression for the quadrature Qdc term can be derived:

$$Qdc = \frac{MA\sin(\phi 1)}{2(1 + MC\cos(\phi c))} \quad (8)$$

The above analysis is somewhat simplified in that for the Idc expression, only the feedback from the in-phase arm of the circuit was considered. In reality, the input signal is composed of the leakage and feedback from both arms and can be written as:

$$A \cos(\omega t + \phi 1) - IdcC(\cos(\omega t + \phi c)) - QdcC(\cos(\omega t + \phi c)) \quad (9)$$

However, since we have assumed the phase shift through both AGC's 32 and 32' is the same, the in-phase and quadrature feedback signals are still in quadrature and the expressions remain the same. Inspection of equations (7) and (8) reveal that for $\phi c < \pi$ the denominator will be greater than zero and there is a stable operating point for the circuit. The expressions also show that as the AGC gain constant increases, the dc levels approach zero on both arms and therefore the leakage also approaches zero.

Figure 4:
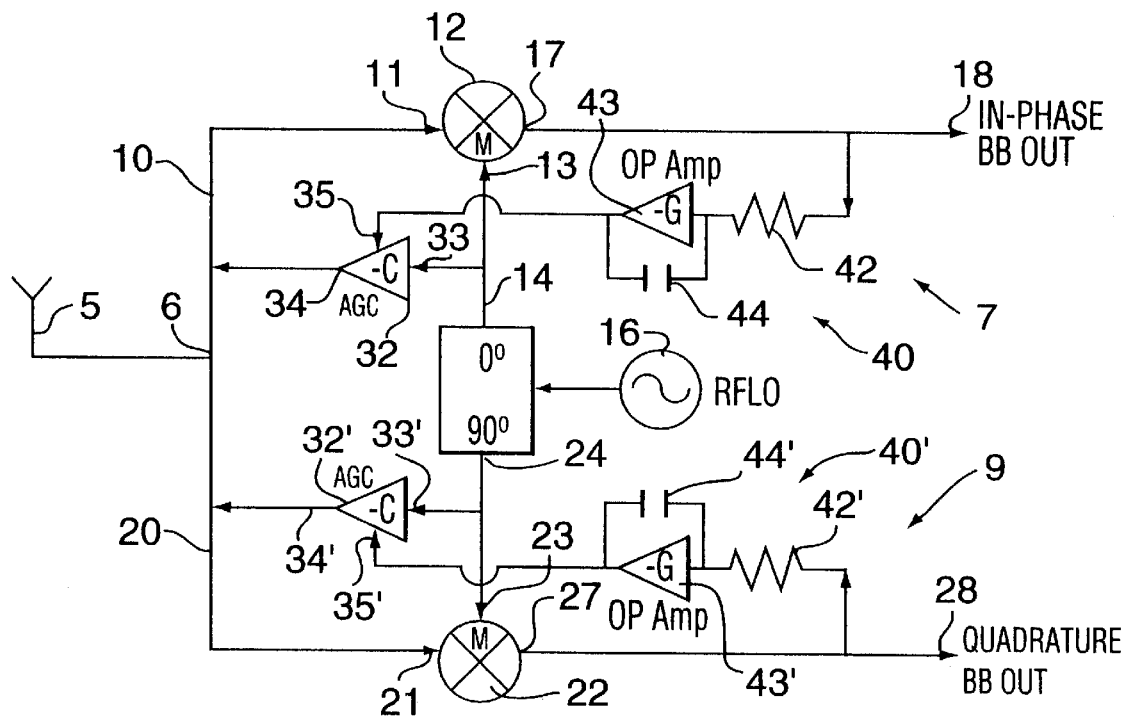
FIG. 4 is a diagram similar to FIG. 3 but illustrating a modified form of the invention.

FIG. 4 is a schematic illustration of a circuit incorporating features of the circuit in FIG. 3 but with improved nulling capabilities and a smaller loop bandwidth. By incorporating integrators it is possible to ensure that the error approaches zero more accurately. The modification over the circuit in FIG. 3 is a direct replacement of the LPF's 37 and 37' with integrator circuits 40 and 40' respectively. There are many ways to construct an integrator circuit and FIG. 4 illustrates one example. The integrator circuit 40 comprises a series resistor 42 inputting to an OP-Amp 43 with gain -G which is bridged by a capacitor 44. Integrator 40' is identical and comprises resistor 42', OP-AMP 43' and capacitor 44'.

Figure 5:
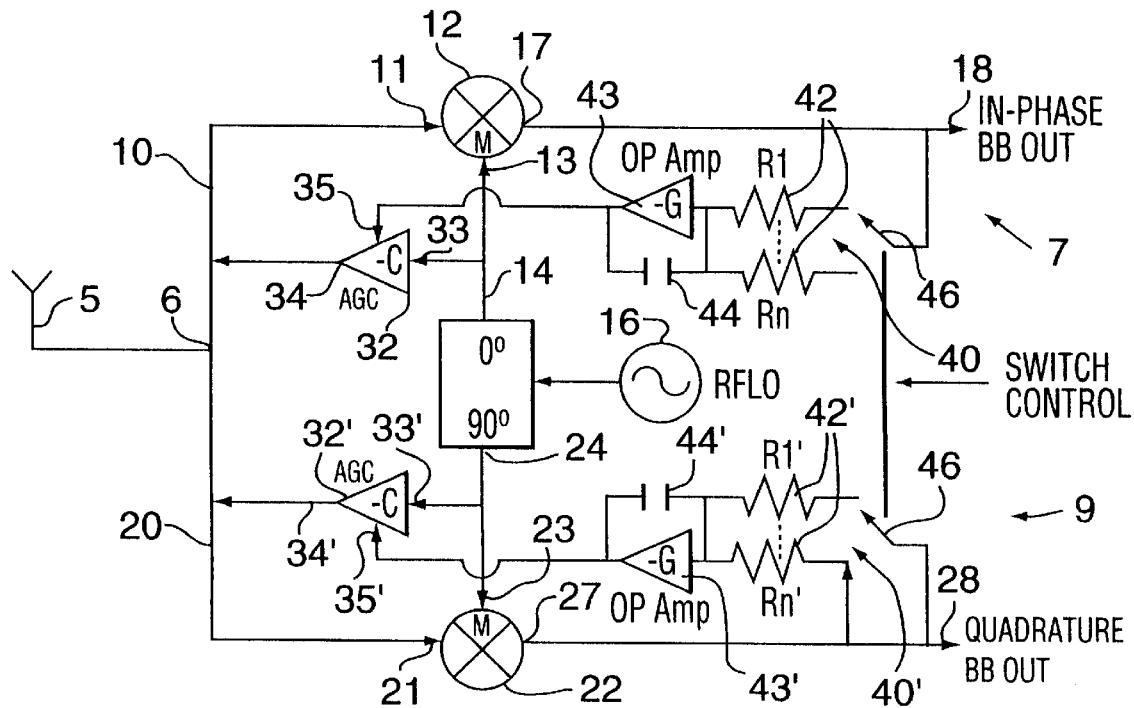
FIG. 5 is a diagram similar to FIG. 4 but illustrating a further modification of the invention.

The circuit of FIG. 5 shows a further modification in which the single resistor 42, 42' in the single stage integrators 40 and 40' in FIG. 4 is replaced by a plurality, n (n>1), of parallel individually addressable resistors 42, 42'. A switch 46 determines the connection of a particular resistor.

This facility allows one to vary the loop bandwidth and adjust the tracking bandwidth. Such an approach could be used, for example, to provide simultaneous rapid acquisition of the LO canceller (large loop bandwidth) and minimal degradation of the low frequency signal once the loop has acquired (a small loop bandwidth).

Figure 6:
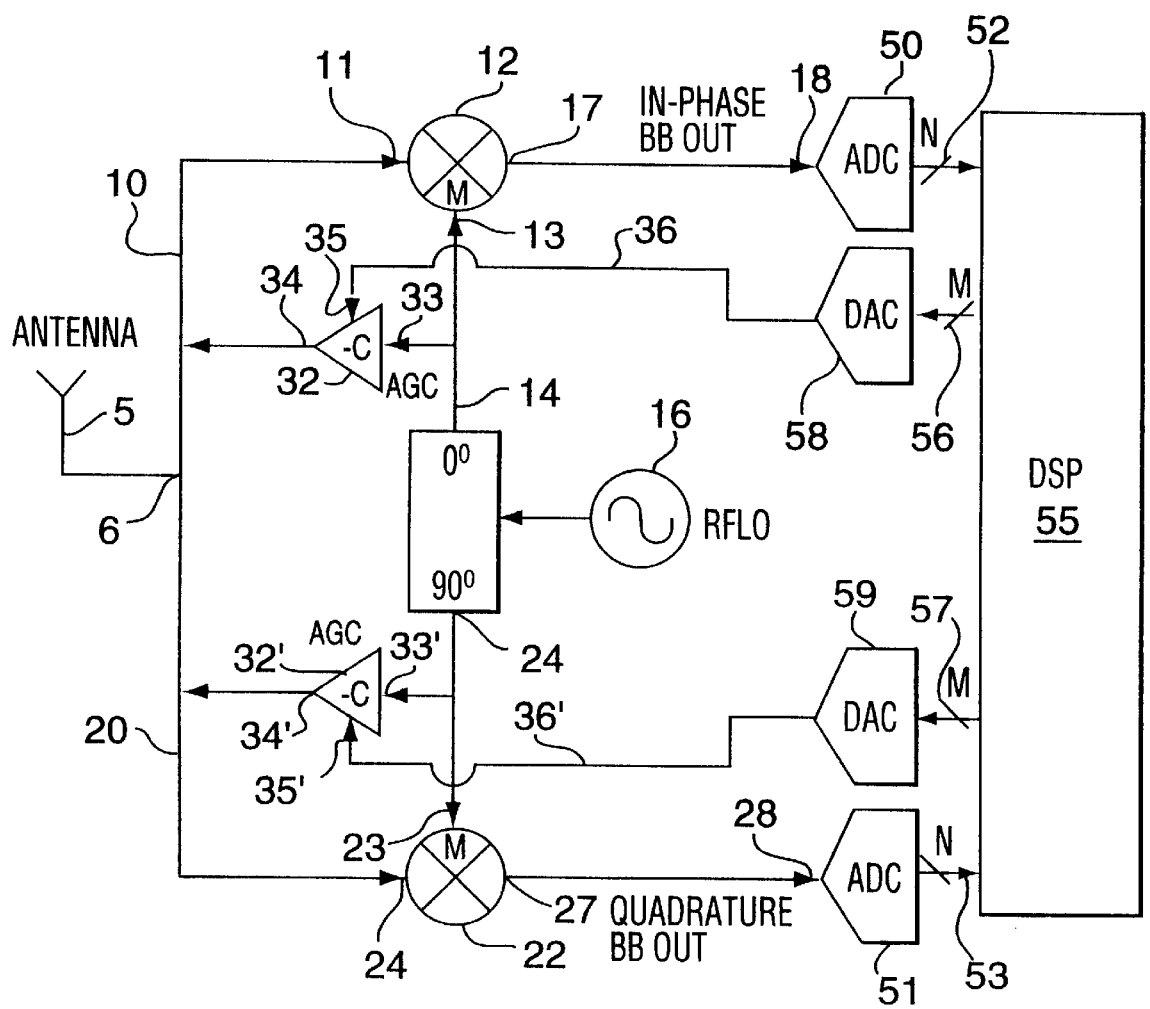
FIG. 6 is a schematic representation of a quadrature downconverter direct converter receiver incorporating a further modified form of leakage cancellation according to the invention incorporating digital signal processing means.

The circuit of FIG. 6 shows how the detection of offset can be done digitally and the resultant DC level fed to the AGC's. This circuit is similar to the circuit of FIG. 3 without LPF's 37 and 37'. The outputs 17 and 27 of mixers 12 and 22 which derive the in-phase and quadrature baseband outputs 18 and 28, respectively, are coupled to Analog to Digital converters (ADCs) 50 and 51, respectively. Outputs 52 and 53 from the ADCs 50 and 51 are N-bit line inputs to a Digital Signal Processing unit 55. M-bit outputs of the DSP 55 are input on lines 56 and 57 input to Digital to Analog Converters (DACs) 58 and 59, respectively. The output of DAC 58 and the output of DAC 59 are coupled to lines controlling inputs 35 and 35', respectively, so providing the necessary voltage gain control to both AGCs 32 and 32', respectively.

This approach has the advantages that it eliminates DC right up to the converter input and the use of digital signal processing makes it very easy to adjust the bandwidth of the loop dynamically.

The disadvantage of this approach is that any offsets in components between the mixer and the converter such as amplifiers or AGC sections will degrade the DC accuracy of the loop and thus will degrade the level of LO suppression at the RF input port. Since the ADC's and DSP are usually present anyway in a receiver unit there is little additional circuitry for this approach which is easily accommodated in an integrated baseband solution. This approach readily lends itself to the implementation of an integrated circuit with possibly more functionality such as amplification, baseband filtering and gain control in an extremely cost effective receiver unit.

We claim:

1. A quadrature downconversion stage for an RF receiver, the quadrature downconversion stage comprising:

a stage input;

a first, in-phase branch connected to the stage input;

a second, quadrature branch connected to the stage input; and a quadrature local oscillator having an in-phase output and a quadrature output, the first branch comprising a first mixer having a first input connected to the stage input, a second input connected to the in-phase output of the quadrature local oscillator and an output on which is derived an in-phase baseband output component and a first feedback circuit coupling the in-phase output of the quadrature local oscillator, modulated by a low frequency portion of the in-phase baseband output component, to the first input of the first mixer thereby to supply a feedback signal which is 180° phase shifted with respect to the in-phase component supplied to the second input of the first mixer, the second branch comprising a second mixer having a first input connected to the stage input, a second input connected to the quadrature output of the quadrature local oscillator and an output on which is derived a quadrature baseband output component and a second feedback circuit coupling the quadrature output of the quadrature local oscillatory modulated by a low frequency portion of the quadrature baseband output component, to the first input of the second mixer thereby to supply a feedback signal which is 180° phase shifted with respect to the quadrature component supplied to the second input of the second mixer.

2. A quadrature downconversion stage according to claim 1, wherein the first feedback circuit comprises a first AGC connected to the in-phase output of the quadrature local oscillator and having an output connected to the stage input and a control input connected to be controlled by a component of the in-phase baseband output component; and the second feedback circuit comprises a second AGC connected to the quadrature component of the quadrature local oscillator and having an output connected to the stage input and a control input connected to be controlled by a component of the quadrature baseband output component.

3. A quadrature downconversion stage according to claim 2, wherein the first feedback circuit further comprises a first low pass filter inserted between the output of the first mixer and the control input of the first AGC; and the second feedback circuit further comprises a second low pass filter inserted between the output of the second mixer and the control input of the second AGC.

4. A quadrature downconversion stage according to claim 2, wherein the first feedback circuit further comprises a first integrator inserted between the output of the first mixer and the control input of the first AGC; and the second feedback circuit further comprises a second integrator inserted between the output of the second mixer and the control input of the second AGC.

5. A quadrature downconversion stage according to claim 4 in which the first and second integrators are each selectively variable.

6. A quadrature downconversion stage according to claim 2, wherein the output of the first mixer is connected through a first AD converter to a digital signal processor and the first feedback circuit comprises a first DA converter connected between the digital signal processor and the control input of the first AGC; and wherein the output of the second mixer is connected through a second AD converter to the digital signal processor and the second feedback circuit comprises a second DA converter connected between the digital signal processor and the control input of the second AGC.

7. A quadrature downconversion stage according to claim 1, wherein the quadrature downconversion stage is a direct conversion stage with the stage input serving as a radio frequency signal input and the quadrature local oscillator operates as a quadrature RF local oscillator.

8. A quadrature downconversion stage according to claim 1, wherein the quadrature downconversion stage is a final stage of an indirect converter with the stage input serving as an IF input and the quadrature local oscillator operates as a quadrature IF local oscillator.

9. An RP receiver having a quadrature direct downconversion stage comprising:

a signal input, a first, in-phase branch connected to the signal input;

a second, in-phase quadrature branch connected to the signal output;

a quadrature RF local oscillator having an in-phase component and a quadrature component;

the first branch comprising a first mixer having a first input connected to the signal input, a second input connected to the in-phase output of the quadrature RP local oscillator and an output on which is derived an in-phase baseband output component and a first feedback circuit coupling the in-phase output of the quadrature RF local oscillator, modulated by a low frequency portion of the in-phase baseband component, to the first input of the first mixer thereby to supply a feedback signal which is 180° phase shifted with respect to the in-phase component supplied to the second input of the first mixer, the second branch comprising a second mixer having a first input connected to the signal input, a second input connected to the quadrature output of the quadrature RF local oscillator and an output on which is derived a quadrature baseband output component and a second feedback circuit coupling the quadrature output of the quadrature local oscillator, modulated by a low frequency portion of the quadrature baseband component, to the first input of the second mixer thereby to supply a feedback signal which is 180° phase shifted with respect to the quadrature component supplied to the second input of the second mixer.

10. An RF receiver having a first mixing stage and a final direct conversion stage, the first mixing stage comprising a signal input;

a mixer having a first input connected to the signal input, a second input connected to an RF local oscillator and an output on which is derived an IF output;

the final mixing stage comprising:

a stage input;

a first, in-phase branch connected to the stage input;

a second, quadrature branch connected to the stage input; and a quadrature local oscillator having an in-phase output and a quadrature output, the first branch comprising a first mixer having a first input connected to the stage input, a second input connected to the in-phase output of the quadrature IF local oscillator and an output on which is derived an in-phase baseband output component and a first feedback circuit coupling the in-phase output of the quadrature IF local oscillator, modulated by a low frequency portion of the in-phase baseband component, to the first input of the first mixer thereby to supply a feedback signal which is 180° phase shifted with respect to the in-phase component supplied to the second input of the first mixer, the second branch comprising a second mixer having a first input connected to the stage input, a second input connected to the quadrature output of the quadrature IF local oscillator and an output on which is derived a quadrature baseband output component and a second feedback circuit coupling the quadrature output of the quadrature IF local oscillator, modulated by a low frequency portion of the quadrature baseband component, to the first input of the second mixer thereby to supply a feedback signal which is 180° phase shifted with respect to the quadrature component supplied to the second input of the second mixer.

11. A method of reducing the effect of leakage from a quadrature local oscillator to an input of a quadrature downconversion stage of an RF receiver, which quadrature downconversion stage has a single input to which a modulated signal containing in-phase and quadrature components is fed, a first output at which an in-phase baseband component is obtained and a second output at which a quadrature baseband component is obtained, the method comprising:

deriving from the quadrature local oscillator and the in-phase baseband component a first feedback signal 180° out of phase with the in-phase component of the signal appearing at the single input and feeding the first feedback signal to the single input; and deriving from the quadrature local oscillator and the quadrature baseband component a second feedback signal 180° out of phase with the quadrature component of a signal appearing at the single input and feeding the second feedback signal to the single input.

* * * * *

UNITED STATES PATENT AND TRADEMARK OFFICE
CERTIFICATE OF CORRECTION

PATENT NO. : 5,918,167
DATED : 06/29/99
INVENTOR(S) : SAMUEL ALFRED TILLER and JACKSON NISBET It is certified that error appears in the above-identified patent and that said Letters Patent is hereby corrected as shown below:

Column 6, line 56 (Claim 1): change "oscillatory" to "oscillator".

Column 7, line 45 (Claim 9): change "RP" to "RF".

Column 7, line 56 (Claim 9): change "RP" to "RF".

Signed and Sealed this

Fifteenth Day of August, 2000

Attest:

Q. TODD DICKINSON

*Attesting Officer*      *Director of Patents and Trademarks*